United States Patent
Hirabayashi et al.

(10) Patent No.: US 7,417,439 B2
(45) Date of Patent: *Aug. 26, 2008

(54) IMPEDANCE CONVERSION CIRCUIT AND INTEGRATED CIRCUIT INCLUDING THEREOF

(75) Inventors: Atsushi Hirabayashi, Tokyo (JP); Kenji Komori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/821,726

(22) Filed: Jun. 25, 2007

(65) Prior Publication Data

US 2007/0247168 A1    Oct. 25, 2007

Related U.S. Application Data

(63) Continuation of application No. 11/441,689, filed on May 26, 2006, now Pat. No. 7,235,981.

(30) Foreign Application Priority Data

Jun. 15, 2005   (JP)   ............................. 2005-174657

(51) Int. Cl.
G01R 27/02    (2006.01)
H02M 1/00    (2007.01)
(52) U.S. Cl. ...................................... 324/607; 327/103
(58) Field of Classification Search .................. 324/607, 324/605, 602, 600, 120; 327/103, 363; 307/151; 363/73; 702/126
See application file for complete search history.

(56) References Cited

U.S. PATENT DOCUMENTS

| 4,591,739 | A | 5/1986 | Nagano |
| 5,126,586 | A | 6/1992 | Gilbert |
| 5,249,224 | A | 9/1993 | Cahmbers |
| 6,107,842 | A | 8/2000 | Hirabayashi et al. |
| 6,346,804 | B2 | 2/2002 | Ueno et al. |
| 6,577,139 | B2 | 6/2003 | Cooper |
| 6,828,832 | B2 | 12/2004 | Gabillard |
| 6,906,586 | B2 | 6/2005 | Sakurai |
| 7,196,555 | B2 * | 3/2007 | Taylor ........................ 327/103 |

(Continued)

FOREIGN PATENT DOCUMENTS

JP    11-205087    7/1999

*Primary Examiner*—Vincent Q. Nguyen
*Assistant Examiner*—Hoai-An D Nguyen
(74) *Attorney, Agent, or Firm*—Robert J. Depke; Rockey, Depke & Lyons, LLC

(57) ABSTRACT

An impedance conversion circuit including: a first voltage-to-current converter and a second voltage-to-current converter supplied with differential input signal voltages; an inverting amplifier; and a third voltage-to-current converter for feedback; wherein a first resistance and a second resistance are connected in series with each other between an input terminal and an output terminal of the inverting amplifier, an output terminal of the first voltage-to-current converter is connected to the input terminal of the inverting amplifier, an output terminal of the second voltage-to-current converter is connected to a connection node of the first resistance and the second resistance, the output terminal of the inverting amplifier is connected to an input terminal of the third voltage-to-current converter, an output terminal of the third voltage-to-current converter is connected to an input terminal of the first voltage-to-current converter, and an impedance is connected between the connection node and a ground.

6 Claims, 18 Drawing Sheets

U.S. PATENT DOCUMENTS

| | | |
|---|---|---|
| 7,224,193 B2 * | 5/2007 | Sudou et al. ................ 327/103 |
| 2003/0122551 A1 | 7/2003 | Male |
| 2005/0030046 A1 | 2/2005 | Yakabe et al. |
| 2005/0099211 A1 | 5/2005 | Dahlin |

* cited by examiner

FIG. 4

$$\text{Vout} = R2 \times \left\{ gm1 \times \left(1 + \frac{R1}{R2}\right) - gm2 + \frac{gm1 \cdot R1}{Z} \right\} \times \text{Vin} \quad \ldots \text{1)}$$

$$gm2 = gm1 \times \left(1 + \frac{R1}{R2}\right) \quad \ldots \text{2)}$$

$$\text{Vout} = R2 \times \frac{gm1 \cdot R1}{Z} \times \text{Vin} \quad \ldots \text{3)}$$

$$\text{Iin} = \text{Vout} \times gm0 = \frac{gm0 \cdot gm1 \cdot R1 \cdot R2}{Z} \times \text{Vin} \quad \ldots \text{4)}$$

$$\text{Zin} = \frac{\text{Vin}}{\text{Iin}} = \frac{Z}{gm0 \cdot gm1 \cdot R1 \cdot R2} \quad \ldots \text{5)}$$

FIG.9

$$V_{out} = R2 \times \left\{ gm1 \times \left(1 + \frac{R1}{R2}\right) - gm2 + \frac{gm1 \cdot R1}{Z} \right\} \times V_{in} \quad \ldots (11)$$

$$V_{out}' = -R2 \times \left\{ gm1 \times \left(1 + \frac{R1}{R2}\right) - gm2 + \frac{gm1 \cdot R1}{Z} \right\} \times V_{in} \quad \ldots (12)$$

$$V_{out}' = -V_{out} \quad \ldots (13)$$

$$gm2 = gm1 \times \left(1 + \frac{R1}{R2}\right) \quad \ldots (14)$$

$$V_{out}' = -R2 \times \frac{gm1 \cdot R1}{Z} \times V_{in} = -G \times V_{in} \quad \ldots (15)$$

$$G = R2 \times \frac{gm1 \cdot R1}{Z} \quad \ldots (16)$$

$$I_{in}' = V_{out}' \times gm0 = -\frac{gm0 \cdot gm1 \cdot R1 \cdot R2}{Z} \times V_{in} \quad \ldots (17)$$

$$Z_{in}' = \frac{-V_{in}}{I_{in}'} = \frac{Z}{gm0 \cdot gm1 \cdot R1 \cdot R2} = \frac{1}{gm0 \cdot G} \quad \ldots (18)$$

FIG.15

$$\text{Vout} = \frac{gm1 \cdot R1 \cdot R2}{Z} \times (Va-Vd) = G \times (Va-Vd) \quad \ldots 21)$$

$$\text{Vout}' = \frac{gm1 \cdot R1 \cdot R2}{Z} \times (Vb-Vc) = G \times (Vb-Vc) \quad \ldots 22)$$

$$G = \frac{gm1 \cdot R1 \cdot R2}{Z} \quad \ldots 23)$$

---

$$\frac{Vin-Va}{R} = (Va-Vd) \times G \times gm0 \quad \ldots 31)$$

$$-\frac{Vd}{R} = (Va-Vd) \times G \times gm0 \quad \ldots 32)$$

$$Vd = Va - Vin \quad \ldots 33)$$

$$Va = Vin \times (1 - G \times gm0 \times R) \quad \ldots 34)$$

$$Vd = -G \times gm0 \times R \times Vin \quad \ldots 35)$$

---

$$\frac{-Vin-Vb}{R} = (Vb-Vc) \times G \times gm0 \quad \ldots 41)$$

$$-\frac{Vc}{R} = (Vb-Vc) \times G \times gm0 \quad \ldots 42)$$

$$Vc = Vin + Vb \quad \ldots 43)$$

$$Vb = -Vin \times (1 - G \times gm0 \times R) \quad \ldots 44)$$

$$Vc = G \times gm0 \times R \times Vin \quad \ldots 45)$$

FIG.16

$$Ia = \frac{Vin - Va}{R} = G \times gm0 \times Vin \quad \ldots \S 1)$$

$$Ib = \frac{-Vin - Vb}{R} = -G \times gm0 \times Vin \quad \ldots \S 2)$$

$$Id = \frac{-Vd}{R} = G \times gm0 \times Vin \quad \ldots \S 3)$$

$$Ic = \frac{-Vc}{R} = -G \times gm0 \times Vin \quad \ldots \S 4)$$

$$V1 = Va = Vin(1 - G \times gm0 \times R) = -Vb \quad \ldots \S 5)$$

$$V2 = Vc = G \times gm0 \times R \times Vin = -Vd \quad \ldots \S 6)$$

$$\frac{Vin - V1}{R} = \frac{V1 - (-V2)}{Z12} \quad \ldots \S 7)$$

$$Z12 = \frac{V1 + V2}{Vin - V1} \times R$$

$$= \frac{Vin(1 - G \times gm0 \times R) + G \times gm0 \times R \times Vin}{Vin - Vin(1 - G \times gm0 \times R)} \times R$$

$$= \frac{1}{G \times gm0} = \frac{Z}{gm0 \times gm1 \times R1 \times R2} \quad \ldots \S 8)$$

FIG.22

$$V_{out} = \frac{gm1 \cdot R1 \cdot R2}{Z} \times (V_a - V_d) = G \times (V_a - V_d) \quad \ldots 61)$$

$$G = \frac{gm1 \cdot R1 \cdot R2}{Z} \quad \ldots 62)$$

$$G12 = \frac{gm1 \cdot R1 \cdot R2}{Z} \quad \ldots 63)$$

$$I_a = \frac{V_{in} - V_a}{R} = \frac{V_a}{Z11} + (V_a - V_d) \cdot G12 \cdot gm12 \quad \ldots 65)$$

$$I_b = \frac{-V_{in} - V_b}{R} = \frac{V_b}{Z11} + (V_b - V_c) \cdot G12 \cdot gm12 \quad \ldots 66)$$

$$I_c = \frac{-V_c}{R} = \frac{V_c}{Z22} + (V_b - V_c) \cdot G12 \cdot gm12 \quad \ldots 67)$$

$$I_d = \frac{-V_d}{R} = \frac{V_d}{Z22} + (V_a - V_d) \cdot G12 \cdot gm12 \quad \ldots 68)$$

FIG.23

$$V_c = \frac{-V_{in} + V_a \cdot (1 + R/Z11)}{1 + R/Z22} \quad \ldots \text{71)}$$

$$V_d = \frac{V_{in} + V_b \cdot (1 + R/Z11)}{1 + R/Z22} \quad \ldots \text{72)}$$

$$V_c + V_d = \frac{(V_a + V_b) \cdot (1 + R/Z11)}{1 + R/Z22} \quad \ldots \text{73)}$$

$$V_c + V_d = (V_a + V_b) \cdot \left(1 + \frac{1}{G12 \cdot gm12 \cdot Z11} + \frac{1}{G12 \cdot gm12 \cdot R}\right) \quad \ldots \text{74)}$$

$$V_a + V_b = 0, \quad V_c + V_d = 0 \quad \ldots \text{75)}$$

$$V_b = -V_a, \quad V_d = -V_c \quad \ldots \text{76)}$$

$$Z12 = \frac{1}{G12 \times gm12} = \frac{Z}{gm12 \cdot gm1 \cdot R1 \cdot R2} \quad \ldots \text{78)}$$

IMPEDANCE CONVERSION CIRCUIT AND INTEGRATED CIRCUIT INCLUDING THEREOF

CROSS REFERENCES TO RELATED APPLICATIONS

The subject matter of application Ser. No. 11/441,689 is incorporated herein by reference. The present invention is a continuation of U.S. application Ser. No. 11/441,689, filed May 26, 2006 now U.S. Pat. No. 7,235,981, which claims priority to Japanese Patent Application JP 2005-174657 filed with the Japanese Patent Office on Jun. 15, 2005, the entire contents of which being incorporated herein by reference.

BACKGROUND OF THE INVENTION

1. Field of the Invention

The present invention relates to an impedance conversion circuit that makes an impedance including an inductance and an integrated circuit including thereof.

2. Description of the Related Art

It is difficult to make a desired impedance, especially an inductance within a semiconductor integrated circuit.

Japanese Patent Laid-open No. Hei 11-205087 discloses an impedance conversion circuit using a plurality of operational amplifiers as shown in FIG. 25 as a circuit that makes an impedance including an inductance.

In this impedance conversion circuit, impedances Z1, Z2, Z3, Z4, and Z5 are connected in series with each other between an input terminal 91, which is supplied with an input signal voltage Vin, and a ground. The input terminal 91 and a connection node of the impedances Z2 and Z3 are connected to the non-inverting input terminal and the inverting input terminal of an operational amplifier 92. The output terminal of the operational amplifier 92 is connected to a connection node of the impedances Z3 and Z4. A connection node of the impedances Z4 and Z5 and a connection node of the impedances Z2 and Z3 are connected to the non-inverting input terminal and the inverting input terminal of an operational amplifier 93. The output terminal of the operational amplifier 93 is connected to a connection node of the impedances Z1 and Z2.

In the impedance conversion circuit, as shown in FIG. 25, an impedance Zin as viewed from the input terminal 91 is $$Zin=(Z1 \cdot Z3 \cdot Z5)/(Z2 \cdot Z4) \quad (91)$$

SUMMARY OF THE INVENTION

However, the impedance conversion circuit in the related art shown in FIG. 25 is based on a precondition that the impedance is made between the input terminal 91 and the ground. Thus, in order to extract the impedance as a two-terminal element, a total of four operational amplifiers are used. Further, in order to extract the impedance as a four-terminal element, a total of eight operational amplifiers are used. Thus, when converted to a two-terminal element or converted to a four-terminal element, the impedance invites an increase in power consumption, and is therefore not suitable for reduction of power consumption.

In addition, since the characteristic, especially the frequency characteristic of the created impedance is determined by the performance of operational amplifiers being used, frequencies for use are limited more as the number of operational amplifiers is increased.

Accordingly, the present invention makes it possible to form an impedance conversion circuit with a small number of elements, reduce power consumption, and widen a frequency band for use.

According to an embodiment of the present invention, there is provided an impedance conversion circuit including: a first voltage-to-current converter and a second voltage-to-current converter supplied with differential input signal voltages; an inverting amplifier; and a third voltage-to-current converter for feedback. In the impedance conversion circuit, a first resistance and a second resistance are connected in series with each other between an input terminal and an output terminal of the inverting amplifier, an output terminal of the first voltage-to-current converter is connected to the input terminal of the inverting amplifier, and an output terminal of the second voltage-to-current converter is connected to a connection node of the first resistance and the second resistance. Further, in the impedance conversion circuit, the output terminal of the inverting amplifier is connected to an input terminal of the third voltage-to-current converter, an output terminal of the third voltage-to-current converter is connected to an input terminal of the first voltage-to-current converter, and an impedance is connected between the connection node and a ground.

The thus formed impedance conversion circuit according to an embodiment of the present invention uses one inverting amplifier such as an operational amplifier or the like, and the voltage-to-current converters can be formed with a very small number of elements. Thus, even in the case of conversion to a two-terminal element or conversion to a four-terminal element, it is possible to form an impedance conversion circuit with a small number of elements, reduce power consumption, and widen a frequency band for use.

As described above, according to an embodiment of the present invention, it is possible to form an impedance conversion circuit with a small number of elements, reduce power consumption, and widen a frequency band for use.

BRIEF DESCRIPTION OF THE DRAWINGS

FIG. 4 is a diagram showing equations of assistance in explaining the circuits of FIGS. 1 to 3;

FIG. 9 is a diagram showing equations of assistance in explaining the circuits of FIGS. 5 to 8;

FIG. 15 is a diagram showing equations of assistance in explaining the circuits of FIGS. 10 to 14;

FIG. 16 is a diagram showing equations of assistance in explaining the circuits of FIGS. 10 to 14;

FIG. 22 is a diagram showing equations of assistance in explaining the circuits of FIGS. 17 to 21;

FIG. 23 is a diagram showing equations of assistance in explaining the circuits of FIGS. 17 to 21;

DETAILED DESCRIPTION OF THE PREFERRED EMBODIMENTS

1. First Embodiment: FIGS. 1 to 4

Figure 1:
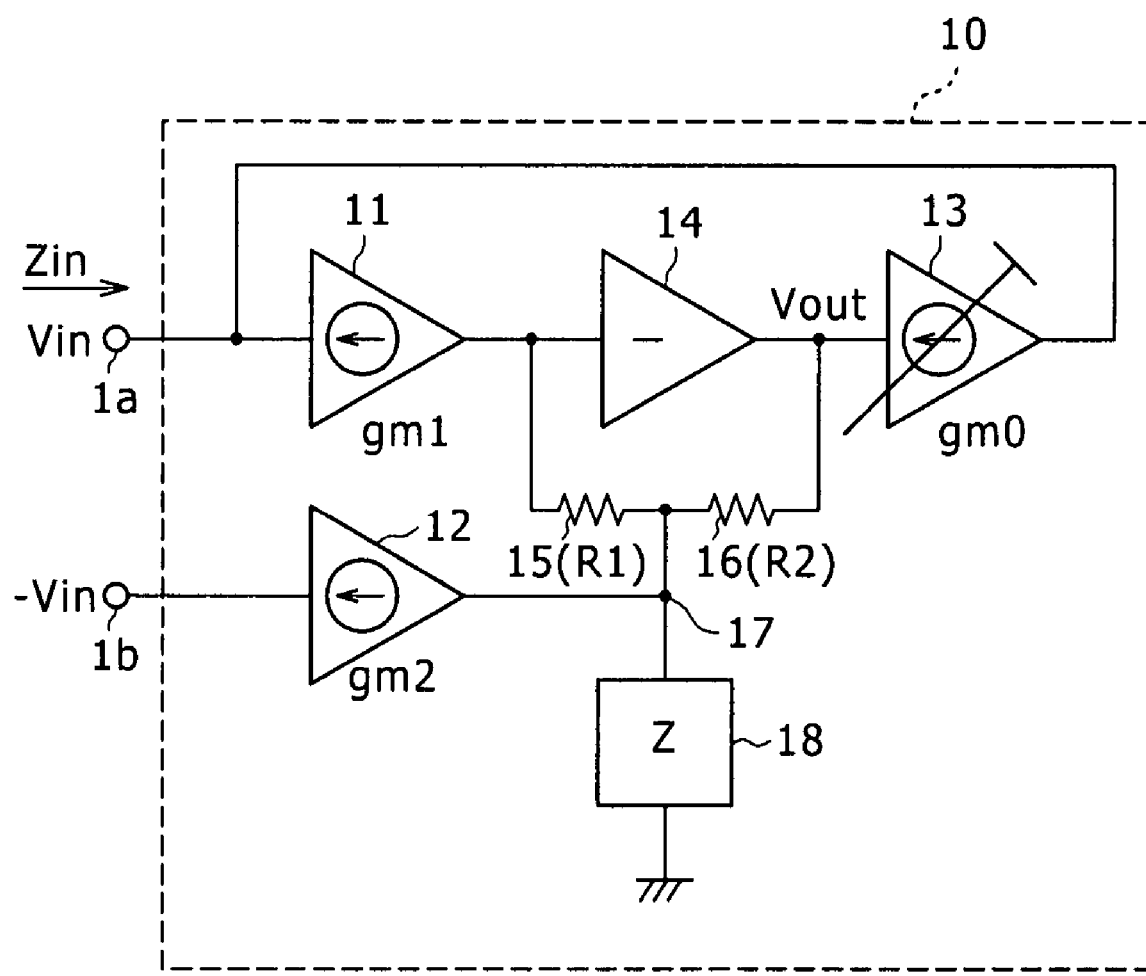
FIG. 1 is a diagram showing an impedance conversion circuit according to a first embodiment.

FIG. 1 shows an impedance conversion circuit according to a first embodiment.

The impedance conversion circuit in this example is formed as a circuit 10 including voltage-to-current converters 11, 12, and 13 and an inverting amplifier 14.

The voltage-to-current converter 11 converts an input signal voltage Vin supplied to an input terminal 1a to an output current. The voltage-to-current converter 12 converts a differential (opposite phase) input signal voltage −Vin with respect to the input signal voltage Vin, the input signal voltage −Vin being supplied to an input terminal 1b, to an output current.

An operational amplifier or the like can be used as the inverting amplifier 14. Resistances 15 and 16 are connected in series with each other between the input terminal (an inverting input terminal in the case of an operational amplifier) and the output terminal of the inverting amplifier 14. An impedance 18 is connected between a connection node 17 of the resistances 15 and 16 and a ground. The output terminal of the voltage-to-current converter 11 is connected to the input terminal of the inverting amplifier 14. The output terminal of the voltage-to-current converter 12 is connected to the connection node 17.

The voltage-to-current converter 13 converts an output voltage Vout of the inverting amplifier 14 to a current, and feeds back the current to the input side of the voltage-to-current converter 11. That is, the input terminal of the voltage-to-current converter 13 is connected to the output terminal of the inverting amplifier 14. The output terminal of the voltage-to-current converter 13 is connected to the input terminal of the voltage-to-current converter 11.

In the thus formed impedance conversion circuit, gm1, gm2, and gm0 express the conductances (voltage-to-current conversion coefficients) of the voltage-to-current converters 11, 12, and 13, respectively. R1 and R2 express the resistance values of the resistances 15 and 16, respectively. Z expresses to be the impedance value of the impedance 18 (for the impedance, an Arabic numeral is used as a reference numeral for the meaning of a circuit or an element, and an alphabetical notation of Z, Zin or the like is used for the meaning of an impedance value). The output voltage Vout of the inverting amplifier 14 is expressed by Equation (1) in FIG. 4.

Supposing that a condition expressed by Equation (2) in FIG. 4 is satisfied between gm1 and gm2, the output voltage Vout is expressed by Equation (3) in FIG. 4.

Thus, a current Iin flowing from the voltage-to-current converter 13 to the input side of the voltage-to-current converter 11 is expressed by Equation (4) in FIG. 4, and an impedance Zin as viewed from the input terminal 1a is expressed by Equation (5) in FIG. 4.

Letting Z=sL (where s is a Laplace operator), it is known in this case that the input impedance Zin is an inductance. Varying gm0 can change the value of the inductance, that is, the value of the impedance.

The parameter gm1, R1, or R2 other than gm0 can be changed. In this case, however, other parameters are changed in such a manner as to be interlocked with the changing of the parameter gm1, R1, or R2 in order to satisfy the condition of Equation (2) in FIG. 4. Thus, parameter change and control becomes difficult, and therefore gm0 is changed.

Figure 2:
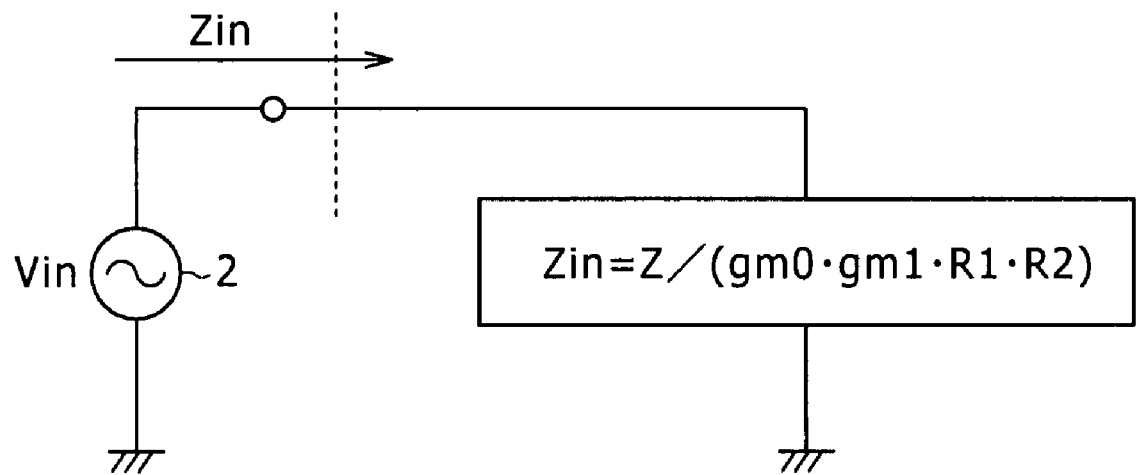
FIG. 2 is a diagram showing an equivalent circuit of the circuit of FIG. 1.

FIG. 2 shows an equivalent circuit as viewed from the input terminal 1a of the impedance conversion circuit in the example of FIG. 1. In this circuit, the impedance Zin expressed by Equation (5) in FIG. 4 exists between a signal source 2 and a ground.

Figure 3:
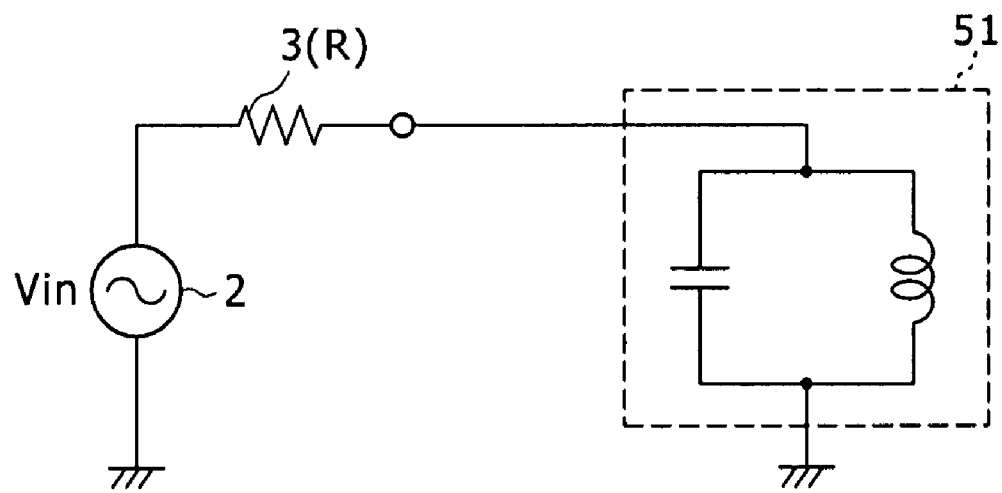
FIG. 3 is a diagram showing a band-pass filter formed by the circuit of FIG. 1.

FIG. 3 shows, as a concrete example, a band-pass filter 51 formed by using a parallel connection circuit of an inductance and a capacitor as the impedance 18 (impedance Z) in FIG. 1 with a drive resistance 3 (resistance value R) attached.

With a configuration in which a linear element such as a resistance or the like is used as the impedance 18 (impedance Z) and gm0 or gm1 can be changed, it is possible to realize a gain control amplifier circuit with a linear gain control characteristic.

2. Second Embodiment: FIGS. 5 to 9

Figure 5:
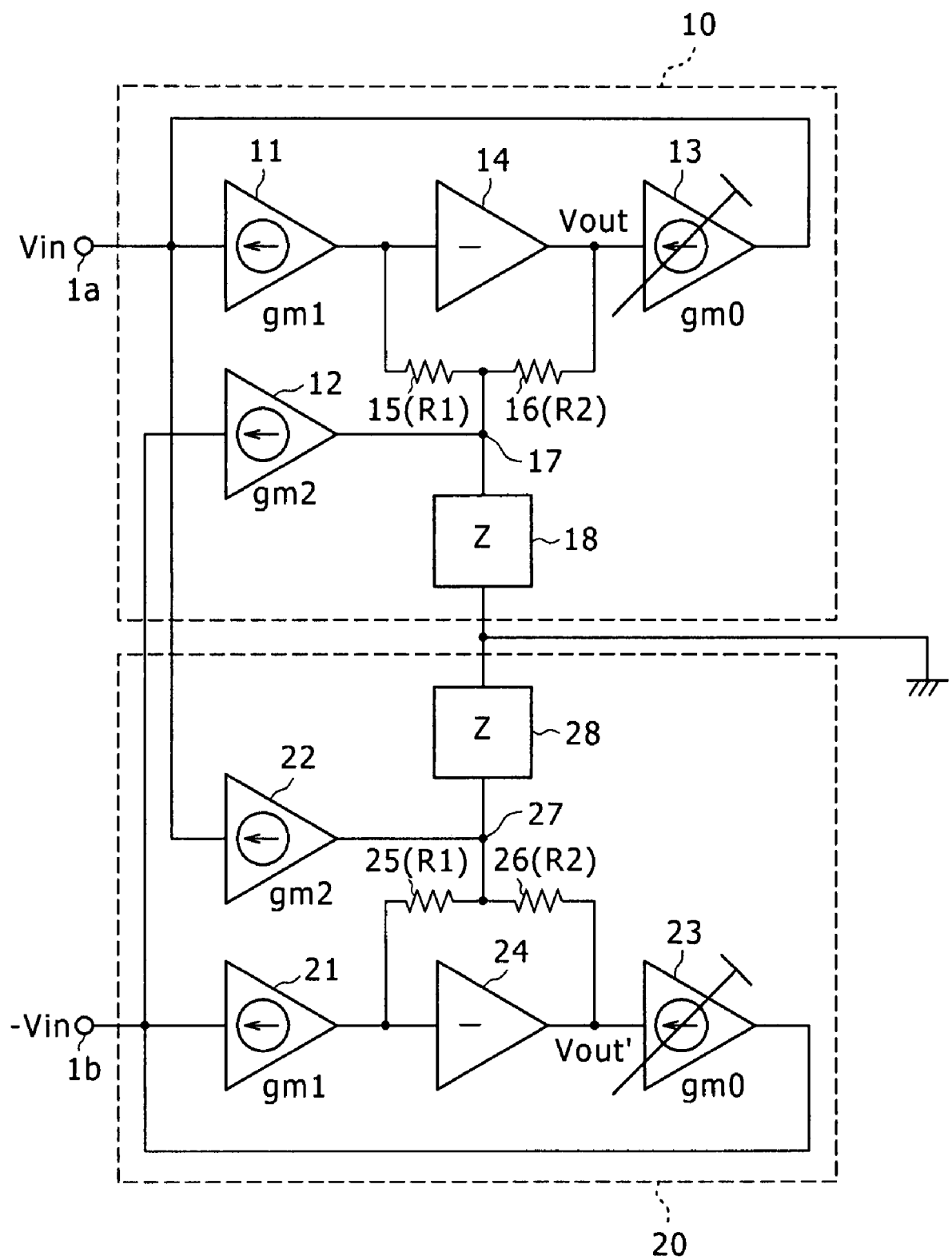
FIG. 5 is a diagram showing an impedance conversion circuit according to a second embodiment.

FIG. 5 shows an impedance conversion circuit according to a second embodiment. The impedance conversion circuit in this example is formed by symmetrically disposing the circuit 10 shown in FIG. 1 and a circuit 20 having the same configuration as that of the circuit 10 for differential input signal voltages Vin and −Vin.

Specifically, in the circuit 20, voltage-to-current converters 21, 22, and 23, an inverting amplifier 24, resistances 25 and 26, a connection node 27, and an impedance 28 are connected in exactly the same manner as in the circuit 10. In contrast to the circuit 10, the input signal voltage −Vin given to an input terminal 1b is supplied to the voltage-to-current converter 21, and the input signal voltage Vin given to an input terminal 1a is supplied to the voltage-to-current converter 22.

Letting gm1 be the conductance of the voltage-to-current converters 11 and 21, gm2 be the conductance of the voltage-to-current converters 12 and 22, gm0 be the conductance of the voltage-to-current converters 13 and 23, R1 be the resistance value of resistances 15 and 25, R2 be the resistance value of resistances 16 and 26, and Z be the impedance value of the impedance 18 and 28, the output voltage Vout of the inverting amplifier 14 is expressed by Equation (11) in FIG. 9, which is the same as Equation (1) in FIG. 4. The output voltage Vout' of the inverting amplifier 24 is similarly expressed by Equation (12) in FIG. 9. The output voltages Vout and Vout' are in differential relation to each other, as expressed by Equation (13) in FIG. 9.

Supposing that a condition expressed by Equation (14) in FIG. 9, which is the same as Equation (2) in FIG. 4, is satisfied between gm1 and gm2, the output voltage Vout' is expressed by Equation (15) in FIG. 9. G in Equation (15) is a transfer function expressed by Equation (16) in FIG. 9.

Thus, a current Iin' flowing from the voltage-to-current converter 23 to the input side of the voltage-to-current converter 21 is expressed by Equation (17) in FIG. 9, and an impedance Zin' as viewed from the input terminal 1b is expressed by Equation (18) in FIG. 9, which is the same as Equation (5) in FIG. 4.

That is, in the example of FIG. 5, the impedance Zin as viewed from the input terminal 1a and the impedance Zin' as viewed from the input terminal 1b are identical with each other, and appear between a ground and the input terminals 1a and 1b, respectively. This is equivalent to the impedance Zin expressed by Equation (5) in FIG. 4 and the impedance Zin' expressed by Equation (18) in FIG. 9 being connected in series with each other between the input terminals 1a and 1b.

Figure 6:
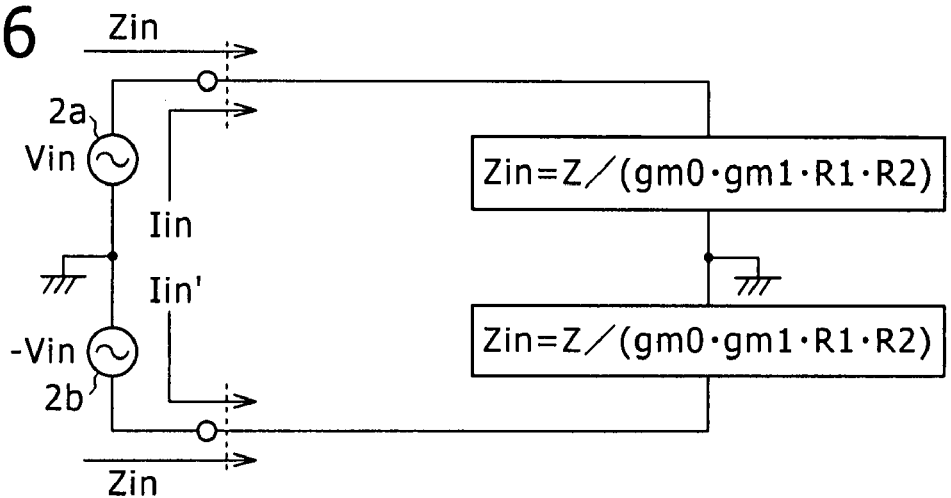
FIG. 6 is a diagram showing an equivalent circuit of the circuit of FIG. 5.

Hence, an equivalent circuit as viewed from the input terminals 1a and 1b of the impedance conversion circuit in the example of FIG. 5 has two identical impedances Zin connected in series with each other between a signal source 2a and a signal source 2b, as shown in FIG. 6.

Figure 7:
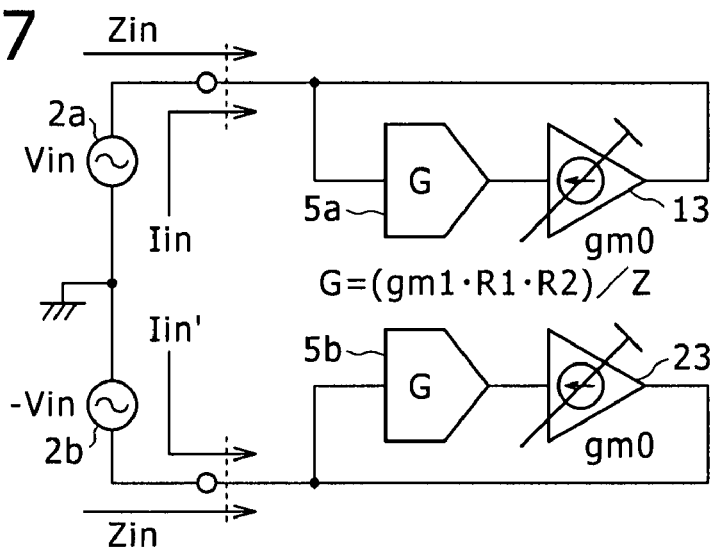
FIG. 7 is a diagram showing an equivalent circuit of the circuit of FIG. 5.

FIG. 7 shows an equivalent circuit when respective parts generating the transfer function G expressed by Equation (16) in FIG. 9 in the circuits 10 and 20 in FIG. 5 are shown as arithmetic circuits 5a and 5b.

Figure 8:
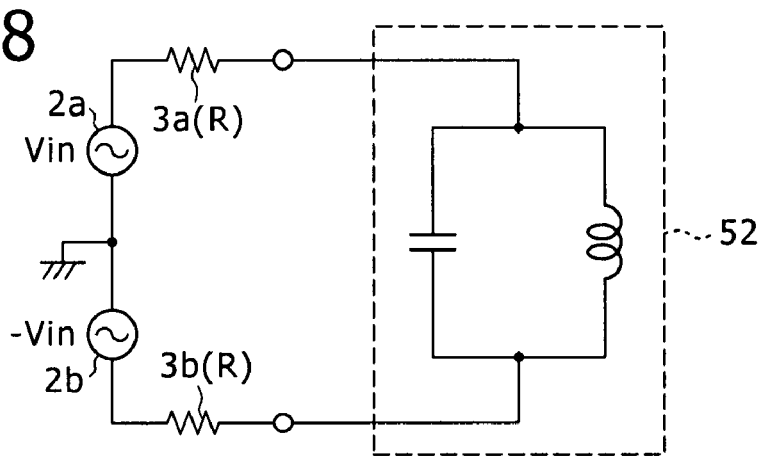
FIG. 8 is a diagram showing a differential type band-pass filter formed by the circuit of FIG. 5.

FIG. 8 shows, as a concrete example, a differential type band-pass filter 52 formed by using a parallel connection circuit of an inductance and a capacitor as the impedances 18 and 28 (impedance Z) in FIG. 5 with drive resistances 3a and 3b (resistance value R) attached.

With a configuration in which a linear element such as a resistance or the like is used as the impedances 18 and 28 (impedance Z) and gm0 or gm1 can be changed, it is possible to realize a gain control amplifier circuit with a linear gain control characteristic.

3. Third Embodiment: FIGS. 10 to 16

Figure 10:
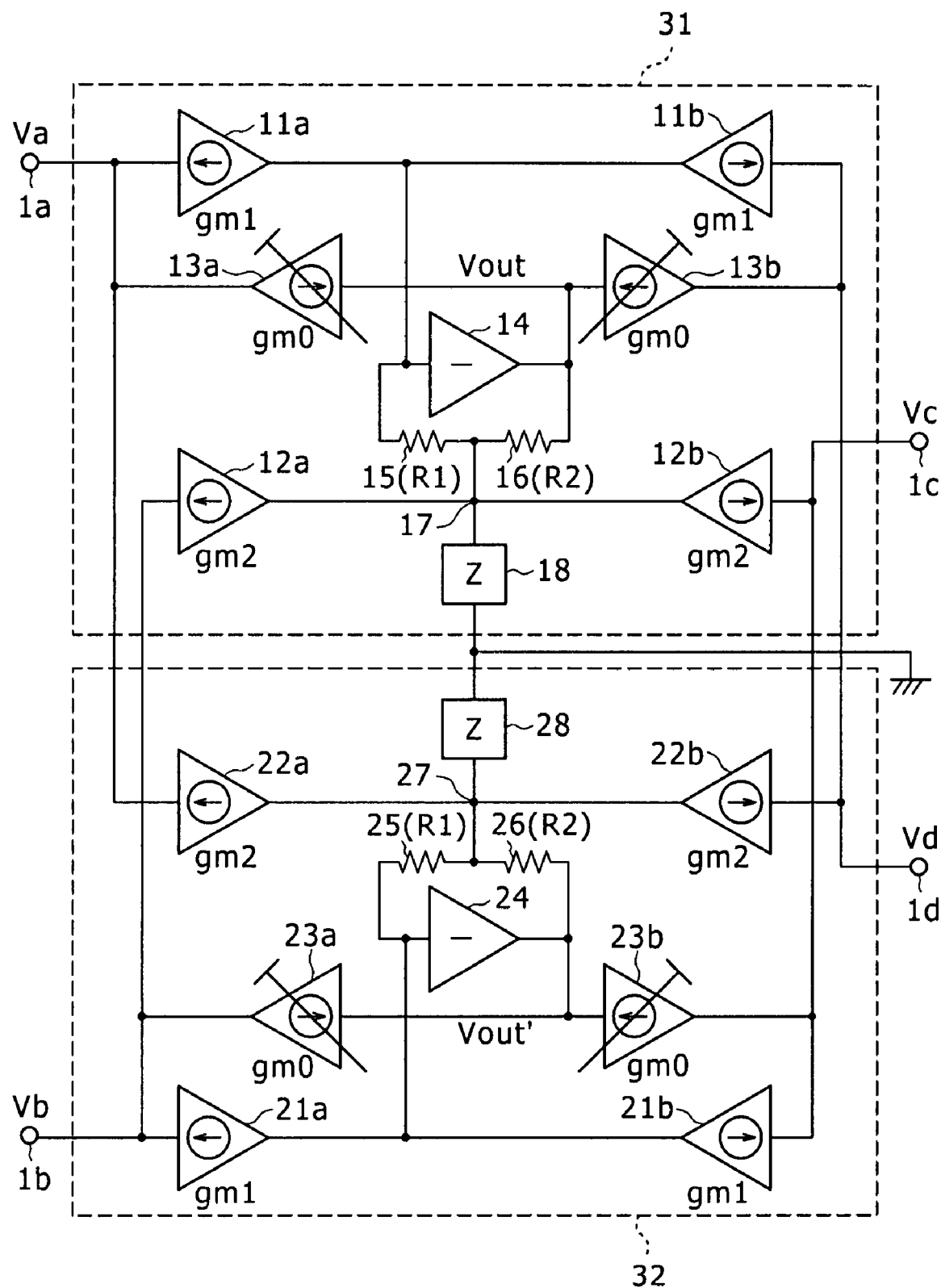
FIG. 10 is a diagram showing an impedance conversion circuit according to a third embodiment.

FIG. 10 shows an impedance conversion circuit according to a third embodiment. The impedance conversion circuit in this example is formed by circuits 31 and 32.

In the circuit 31, two voltage-to-current converters 11a and 11b are provided as converters corresponding to the voltage-to-current converter 11 in the impedance conversion circuit in the example of FIG. 5, two voltage-to-current converters 12a and 12b are provided as converters corresponding to the voltage-to-current converter 12, and two voltage-to-current converters 13a and 13b are provided as converters corresponding to the voltage-to-current converter 13. Resistances 15 and 16 are connected in series with each other between the input terminal and the output terminal of an inverting amplifier 14. An impedance 18 is connected between a connection node 17 of the resistances 15 and 16 and a ground. The output terminals of the voltage-to-current converters 11a and 11b are connected to the input terminal of the inverting amplifier 14. The output terminals of the voltage-to-current converters 12a and 12b are connected to the connection node 17. The input terminals of the voltage-to-current converters 13a and 13b are connected to the output terminal of the inverting amplifier 14. The output terminal of the voltage-to-current converter 13a is connected to the input terminal of the voltage-to-current converter 11a. The output terminal of the voltage-to-current converter 13b is connected to the input terminal of the voltage-to-current converter 11b.

In the circuit 32, two voltage-to-current converters 21a and 21b are provided as converters corresponding to the voltage-to-current converter 21 in the impedance conversion circuit in the example of FIG. 5, two voltage-to-current converters 22a and 22b are provided as converters corresponding to the voltage-to-current converter 22, and two voltage-to-current converters 23a and 23b are provided as converters corresponding to the voltage-to-current converter 23. Resistances 25 and 26 are connected in series with each other between the input terminal and the output terminal of an inverting amplifier 24. An impedance 28 is connected between a connection node 27 of the resistances 25 and 26 and the ground. The output terminals of the voltage-to-current converters 21a and 21b are connected to the input terminal of the inverting amplifier 24. The output terminals of the voltage-to-current converters 22a and 22b are connected to the connection node 27. The input terminals of the voltage-to-current converters 23a and 23b are connected to the output terminal of the inverting amplifier 24. The output terminal of the voltage-to-current converter 23a is connected to the input terminal of the voltage-to-current converter 21a. The output terminal of the voltage-to-current converter 23b is connected to the input terminal of the voltage-to-current converter 21b.

Further, in the circuits 31 and 32, the input terminals of the voltage-to-current converters 11a and 22a and the output terminal of the voltage-to-current converter 13a are connected as a terminal 1a. The input terminals of the voltage-to-current converters 12a and 21a and the output terminal of the voltage-to-current converter 23a are connected as a terminal 1b. The input terminals of the voltage-to-current converters 11b and 22b and the output terminal of the voltage-to-current converter 13b are connected as a terminal 1d. The input terminals of the voltage-to-current converters 12b and 21b and the output terminal of the voltage-to-current converter 23b are connected as a terminal 1c. The terminals 1a and 1b are provided with differential input signal voltages Va and Vb.

Also in this example, supposing that a condition expressed by Equation (14) in FIG. 9 is satisfied, and letting Vc and Vd be the voltages of the terminals 1c and 1d, respectively, in this example, the output voltage Vout of the inverting amplifier 14 and the output voltage Vout' of the inverting amplifier 24 are expressed by Equation (21) and Equation (22) in FIG. 15, with Equation (14) substituted into Equation (11) and Equation (12) in FIG. 9, expressed Vin=Va−Vd in Equation (11), and −Vin=Vb−Vc in Equation (12).

G in Equation (21) and Equation (22) is a transfer function expressed by Equation (23) in FIG. 15, which is the same as Equation (16) in FIG. 9.

Figure 11:
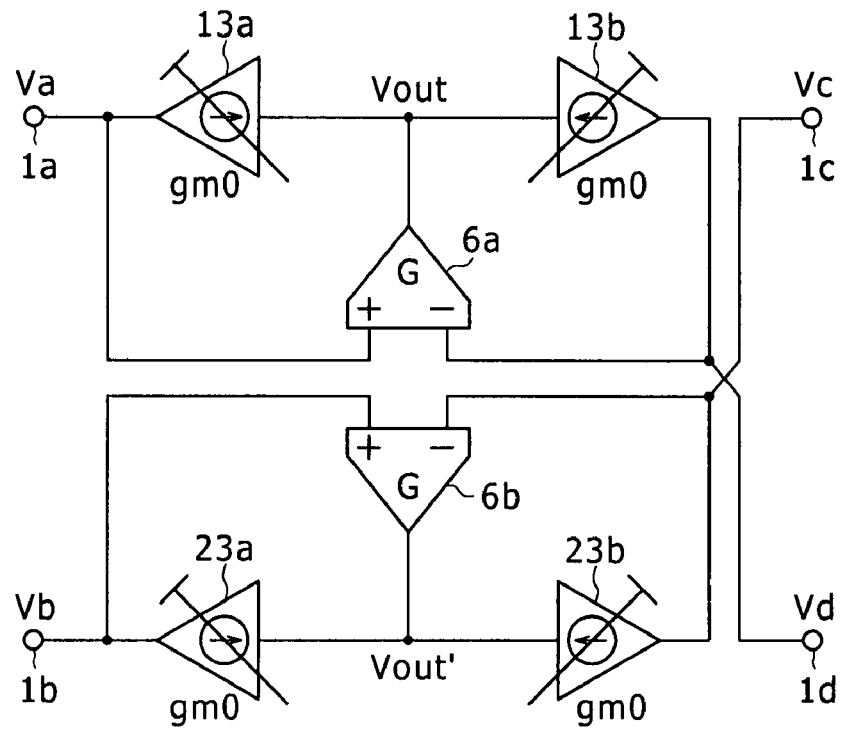
FIG. 11 is a diagram showing an equivalent circuit of the circuit of FIG. 10.

Hence, an equivalent circuit of the impedance conversion circuit in the example of FIG. 10 can be represented as shown in FIG. 11 when parts generating the transfer function G expressed by Equation (23) in FIG. 15 are shown as arithmetic circuits 6a and 6b, respectively.

Figure 12:
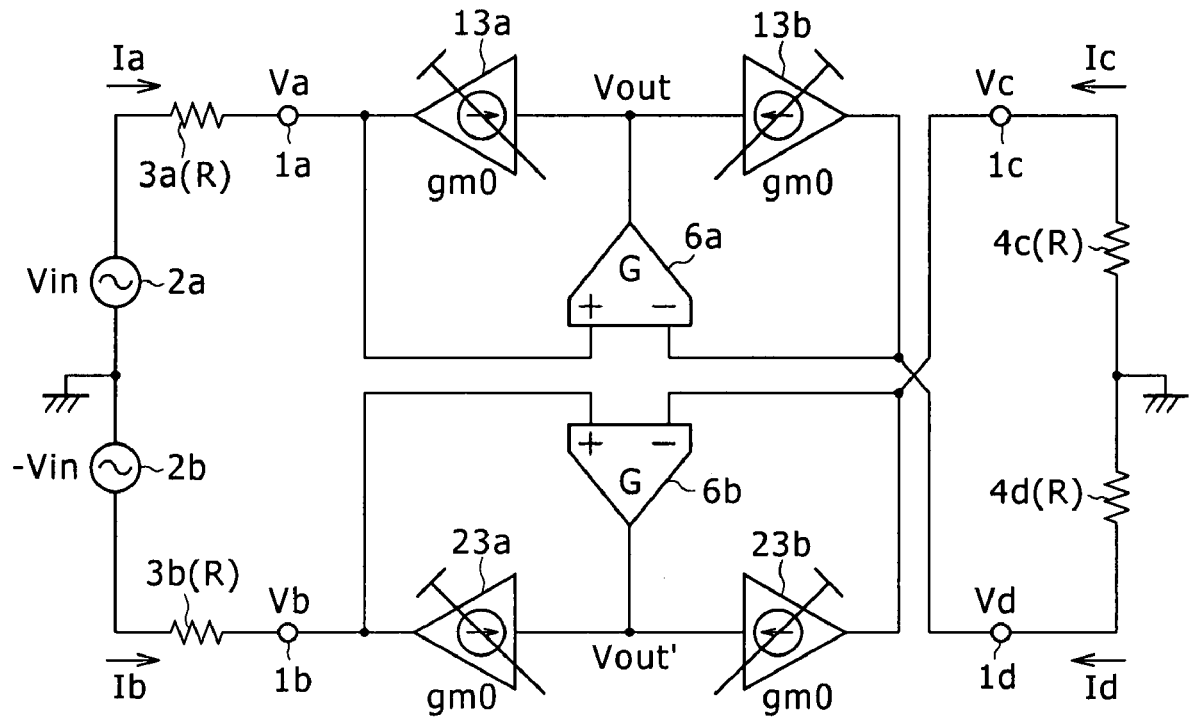
FIG. 12 is a diagram showing an equivalent circuit of the circuit of FIG. 10.

FIG. 12 shows a state of the equivalent circuit in which drive resistances 3a and 3b (resistance value R) and terminating resistances 4c and 4d (resistance value R) are further added. Signal sources 2a and 2b provide differential input signal voltages Vin and −Vin.

In the circuit of FIG. 12, letting Ia be a current flowing through the drive resistance 3a and Id be a current flowing through the terminating resistance 4d, Equation (31) and Equation (32) in FIG. 15 hold for the currents Ia and Id. The voltage Vd is expressed by Equation (33) in FIG. 15. Hence, the voltages Va and Vd are expressed by Equation (34) and Equation (35) in FIG. 15.

Similarly, letting Ib be a current flowing through the drive resistance 3b and Ic be a current flowing through the terminating resistance 4c, Equation (41) and Equation (42) in FIG. 15 hold for the currents Ib and Ic. The voltage Vc is expressed by Equation (43) in FIG. 15. Hence, the voltages Vb and Vc are expressed by Equation (44) and Equation (45) in FIG. 15.

As is clear from a comparison between Equation (34) and Equation (44) and a comparison between Equation (35) and Equation (45), the voltage Va and the voltage Vb are in differential relation to each other, and the voltage Vd and the voltage Vc are in differential relation to each other.

Further, from Equation (34) in FIG. 15, the current Ia is expressed by Equation (51) in FIG. 16. From Equation (44) in FIG. 15, the current Ib is expressed by Equation (52) in FIG. 16. From Equation (35) in FIG. 15, the current Id is expressed by Equation (53) in FIG. 16. From Equation (45) in FIG. 15, the current Ic is expressed by Equation (54) in FIG. 16.

It is understood from Equations (51) to (54) that the currents Ia, Ib, Id, and Ic all have an equal absolute value, that the current Ia flows in a direction of an arrow in FIG. 12 from the terminal 1a to the terminal 1d, and that the current Ib flows in an opposite direction of an arrow in FIG. 12 from the terminal 1c to the terminal 1b.

Figure 13:
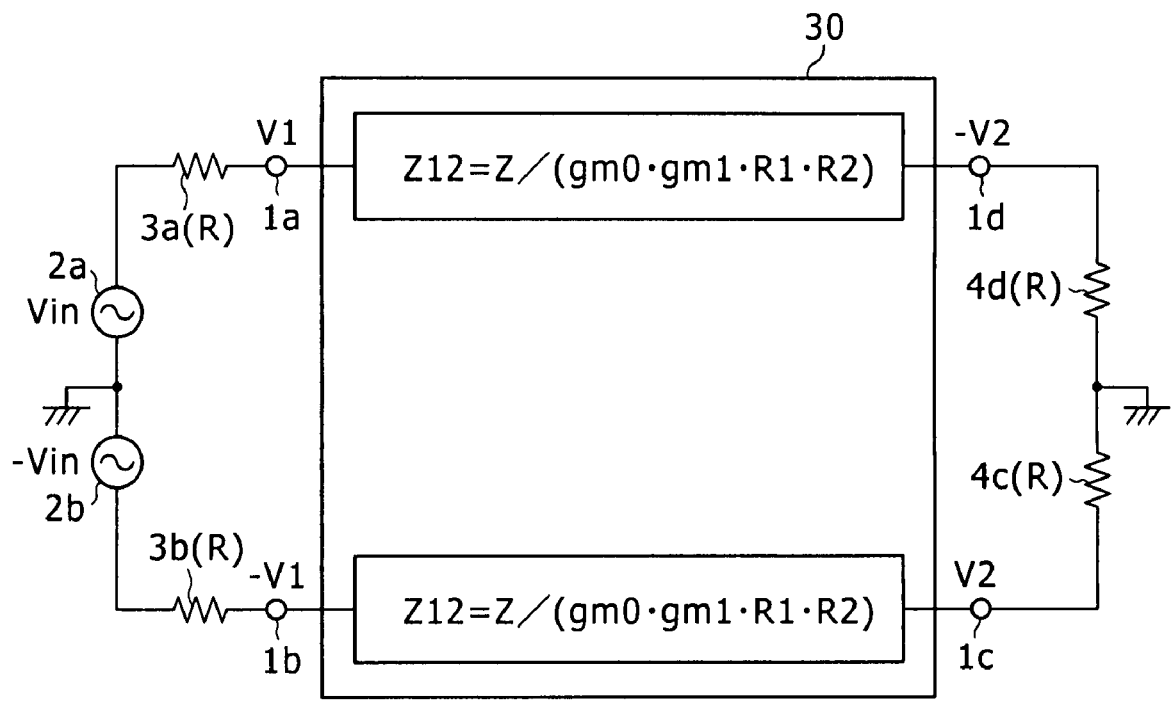
FIG. 13 is a diagram showing a symmetrical four-terminal network formed by the circuit of FIG. 10.

That is, the impedance conversion circuit in the example of FIG. 10 forms a symmetrical four-terminal network 30 with two input terminals and two output terminals, as shown in FIG. 13.

Voltages V1 and −V1 in FIG. 13 correspond to the voltages Va and Vb expressed by Equation (34) and Equation (44) in FIG. 15 and indicate that the two voltages are in differential relation to each other. Voltages V2 and −V2 in FIG. 13 correspond to the voltages Vc and Vd expressed by Equation (45) and Equation (35) in FIG. 15 and indicate that the two voltages are in differential relation to each other.

From Equation (34) and Equation (44) in FIG. 15, the voltage V1 is expressed by Equation (55) in FIG. 16. From Equation (45) and Equation (35) in FIG. 15, the voltage V2 is expressed by Equation (56) in FIG. 16. Letting Z12 be an impedance between the terminals 1a and 1d, Equation (57) in FIG. 16 holds, and the impedance Z12 is expressed by Equation (58) in FIG. 16. An impedance between the terminals 1b and 1c is the same impedance Z12.

Thus, the impedance conversion circuit in the example of FIG. 10 forms the symmetrical four-terminal network 30 between the terminals 1a, 1b, 1d, and 1c.

What is important is that in the case of the differential inputs on an input side and the differential outputs on an output side in the four-terminal network, an impedance as expressed by Equation (58) in FIG. 16 exists as a two-terminal element between the inputs and the outputs in the symmetrical four-terminal network, and that at the same time, various four-terminal networks can be made by a configuration of the used impedance Z. In addition, in the above-described example, it is possible to change the created impedance Z12 by varying gm0.

Figure 14:
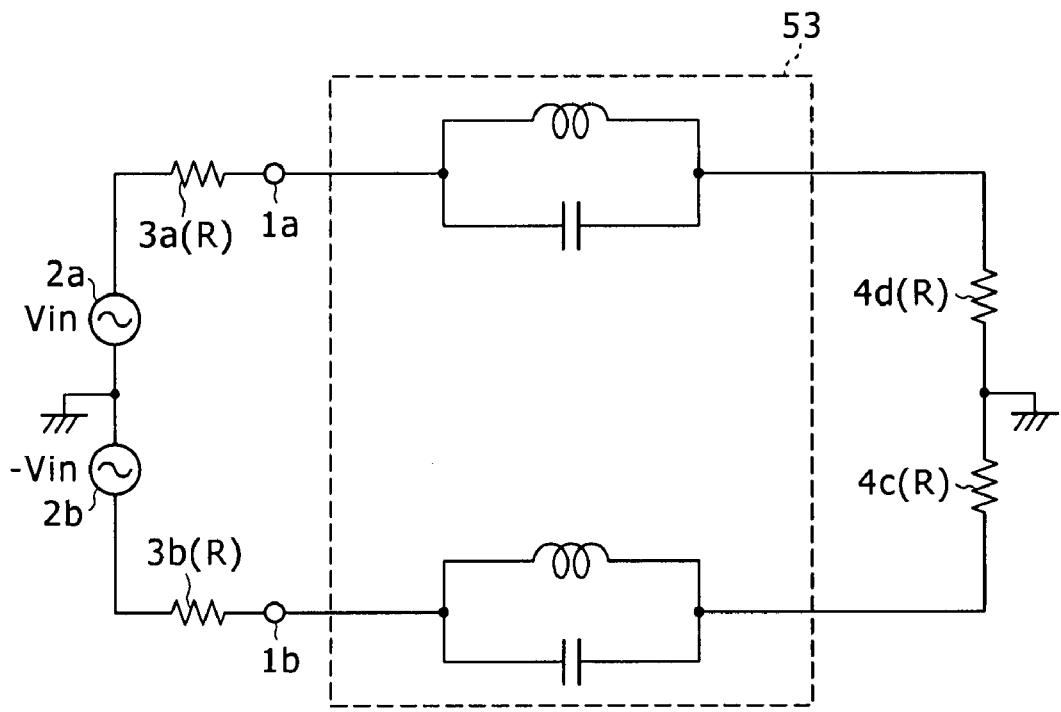
FIG. 14 is a diagram showing a differential type trap circuit formed by the circuit of FIG. 10.

FIG. 14 shows, as a concrete example, a differential type (second-order symmetrical four-terminal type in this case) trap circuit 53 formed by using a parallel connection circuit of an inductance and a capacitor as the impedances 18 and 28 (impedance Z) in FIG. 10.

As in the impedance conversion circuit in the example of FIG. 5, with a configuration in which a linear element such as a resistance or the like is used as the impedances 18 and 28 (impedance Z) and gm0 or gm1 can be changed, it is possible to realize a gain control amplifier circuit with a linear gain control characteristic.

4. Fourth Embodiment: FIGS. 17 to 23

Figure 17:
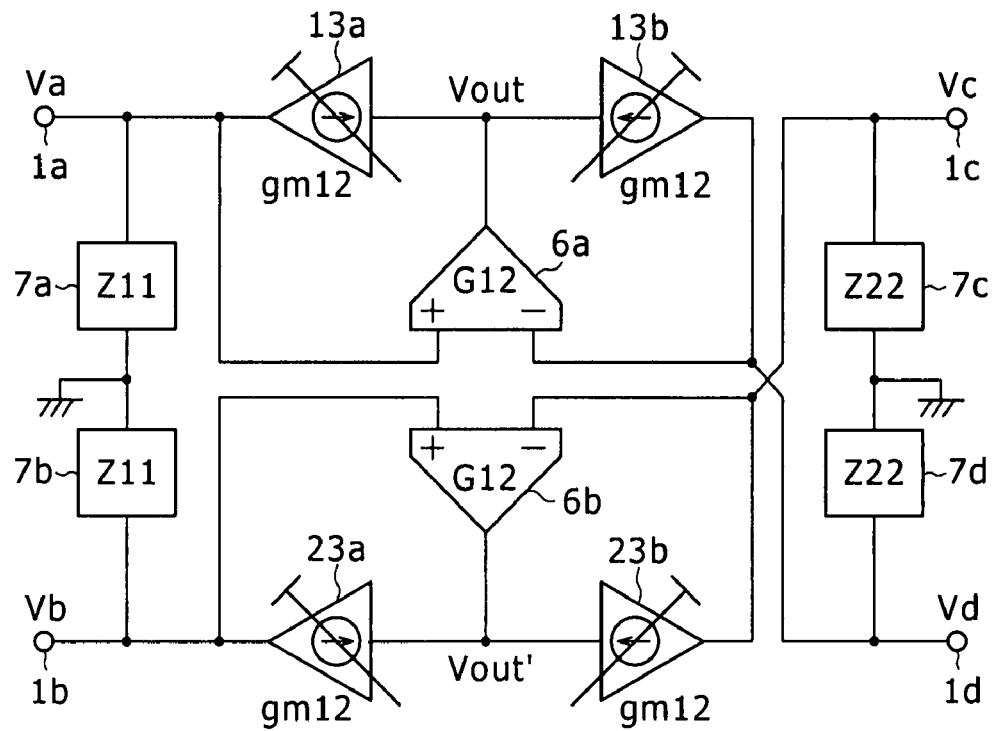
FIG. 17 is a diagram showing an impedance conversion circuit according to a fourth embodiment.

FIG. 17 shows an impedance conversion circuit according to a fourth embodiment.

The impedance conversion circuit in this case is formed by providing the impedance conversion circuit in the example of FIG. 10 forming a symmetrical four-terminal network as in FIG. 11 (FIG. 13) as an equivalent circuit with impedances 7a and 7b (impedance Z11) as a bridge between the terminals 1a and 1b on the input side and impedances 7c and 7d (impedance Z22) as a bridge between the terminals 1c and 1d on the output side.

Also in this case, supposing that a condition expressed by Equation (14) in FIG. 9 is satisfied, the output voltage Vout of an arithmetic circuit 6a is expressed by Equation (61) in FIG. 22, which is the same as Equation (21) in FIG. 15. G in Equation (61) is a transfer function expressed by Equation (62) in FIG. 22, which is the same as Equation (23) in FIG. 15.

In this case, as shown in Equation (63) in FIG. 22, G is replaced with G12, and gm0 is replaced with gm12.

Thus, as shown in FIG. 17, the transfer function generated by arithmetic circuits 6a and 6b is G12, and the conductance of voltage-to-current converters 13a, 13b, 23a, and 23b is gm12.

Figure 18:
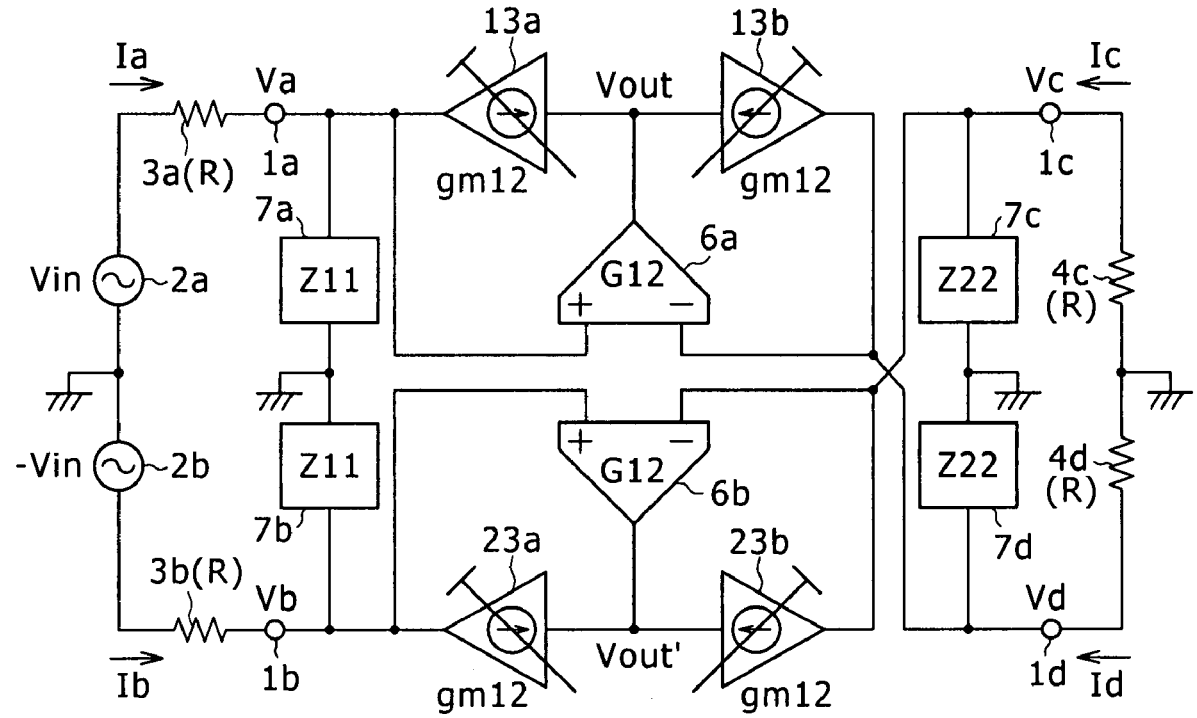
FIG. 18 is a diagram showing the circuit of FIG. 17 provided with drive resistances and terminating resistances.

FIG. 18 shows a state in which drive resistances 3a and 3b (resistance value R) and terminating resistances 4c and 4d (resistance value R) are further added. As described above with reference to FIG. 12, signal sources 2a and 2b provide differential input signal voltages Vin and −Vin.

In the circuit of FIG. 18, currents Ia and Ib flowing through the drive resistances 3a and 3b are expressed by Equation (65) and Equation (66) in FIG. 22, and currents Ic and Id flowing through the terminating resistances 4c and 4d are expressed by Equation (67) and Equation (68) in FIG. 22.

Subtracting Equation (68) from Equation (65) and subtracting Equation (67) from Equation (66) gives voltages Vc and Vd expressed by Equation (71) and Equation (72) in FIG. 23. Further, adding Equation (71) and Equation (72) provides a sum of the voltage Vc and the voltage Vd as expressed by Equation (73) in FIG. 23. In addition, adding Equation (65) and Equation (66) in FIG. 22 provides a sum of the voltage Vc and the voltage Vd as expressed by Equation (74) in FIG. 23.

Thus, since Equation (73) is equal to Equation (74), as shown by Equation (75) in FIG. 23, a sum of a voltage Va and a voltage Vb and a sum of the voltage Vc and the voltage Vd are each zero, and as shown by Equation (76) in FIG. 23, the voltage Va and the voltage Vb are in differential relation to each other and the voltage Vc and the voltage Vd are in differential relation to each other. Further, it is understood from these differential relations that as for the currents expressed by Equations (65) to (68) in FIG. 22, Ib=Ia and Id=−Ic.

Figure 19:
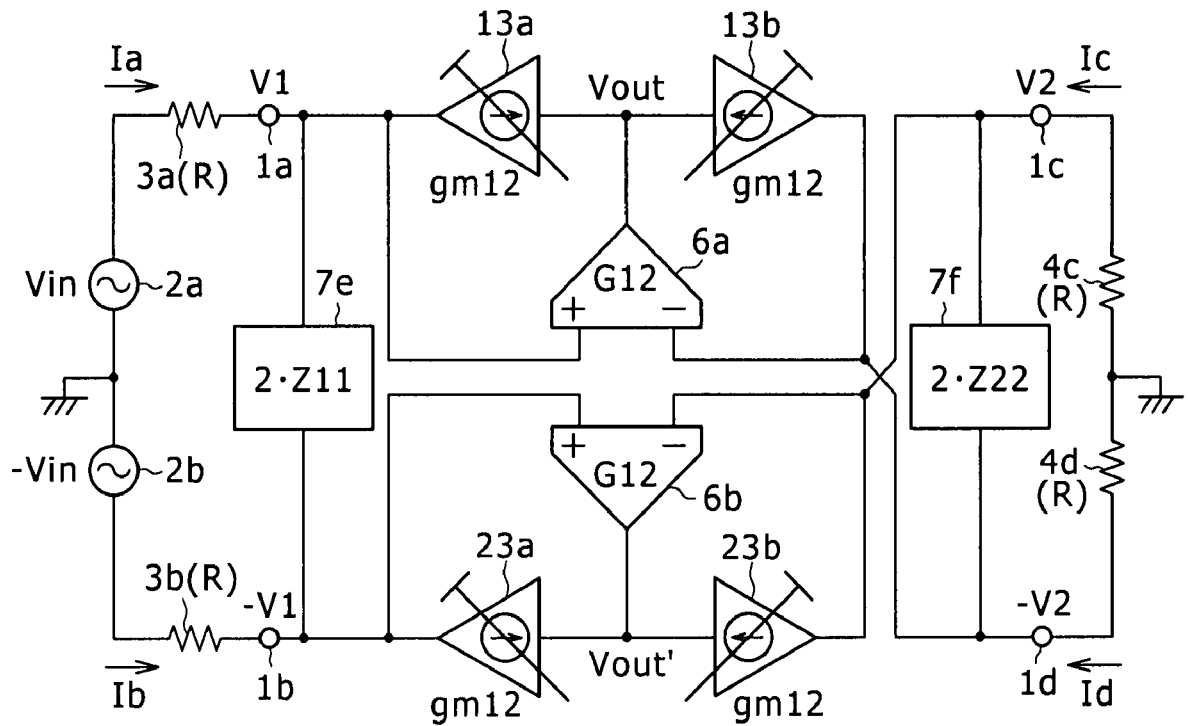
FIG. 19 is a diagram showing a different representation of the circuit of FIG. 18.

From the above results, the circuit of FIG. 18 can be represented as in FIG. 19. Voltages V1 and −V1 in FIG. 19 correspond to the voltages Va and Vb and indicate that the two voltages are in differential relation to each other. Voltages V2 and −V2 correspond to the voltages Vc and Vd and indicate that the two voltages are in differential relation to each other.

One impedance 7e represents the impedances 7a and 7b on the input side. One impedance 7f represents the impedances 7c and 7d on the output side.

As described above with reference to FIGS. 10 to 14, in the case of the differential inputs on the input side and the differential outputs on the output side in the four-terminal network, an impedance Z12 expressed by Equation (58) in FIG. 16 exists as a two-terminal element between the inputs and the outputs.

Figure 20:
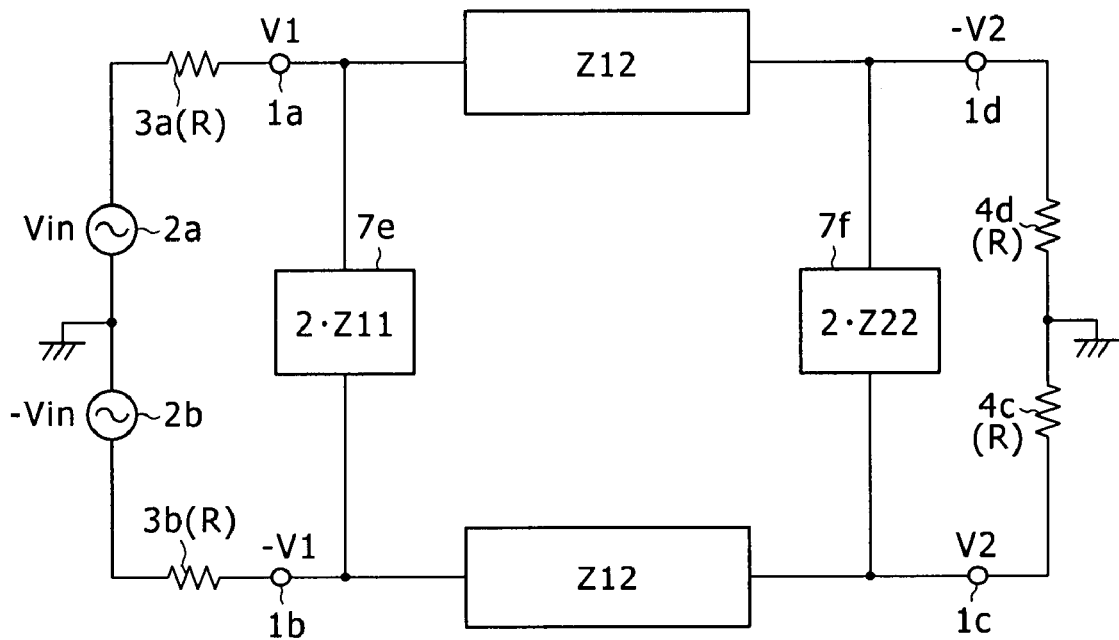
FIG. 20 is a diagram showing a symmetrical four-terminal network formed by the circuit of FIG. 17.

Also in the example of FIGS. 17 to 19, as shown in FIG. 20, an impedance Z12 expressed by Equation (78) in FIG. 23, which equation is obtained by rewriting Equation (58) in FIG. 16, exists as a two-terminal element.

Thus, in this example, a ladder circuit can be formed as shown in FIG. 20. It is thereby possible to realize a steep filtering characteristic of a Chebyshev filter or the like within an integrated circuit.

Figure 21:
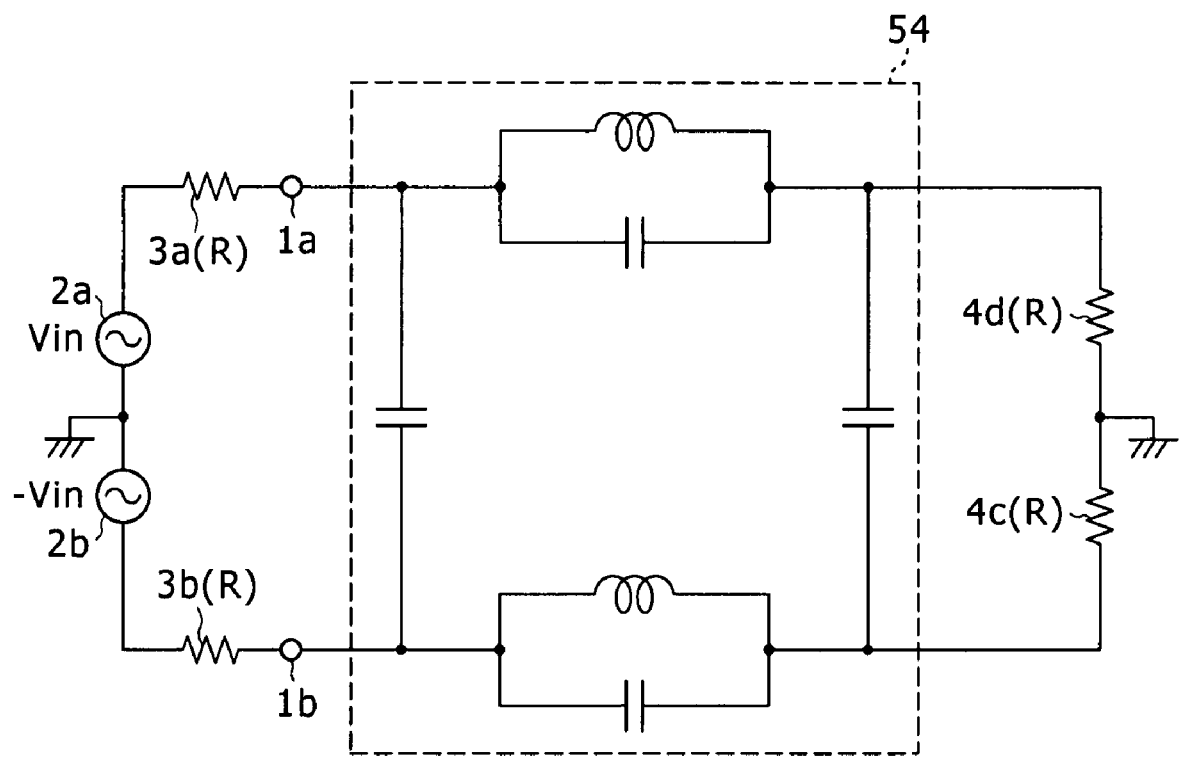
FIG. 21 is a diagram showing a differential type third-order low-pass filter formed by the circuit of FIG. 17.

FIG. 21 shows, as a concrete example, a differential type third-order low-pass filter (third-order Chebyshev type low-pass filter) 54 formed by using a parallel connection circuit of an inductance and a capacitor as the impedance Z (impedances 18 and 28 that, though not shown in FIG. 17, are shown in FIG. 10) and using a capacitor as the impedances 7e and 7f.

As in the impedance conversion circuit in the example of FIG. 10, with a configuration in which a linear element such as a resistance or the like is used as the impedances 18 and 28 (impedance Z) and gm12 or gm1 can be changed, it is possible to realize a gain control amplifier circuit with a linear gain control characteristic.

Figure 24:
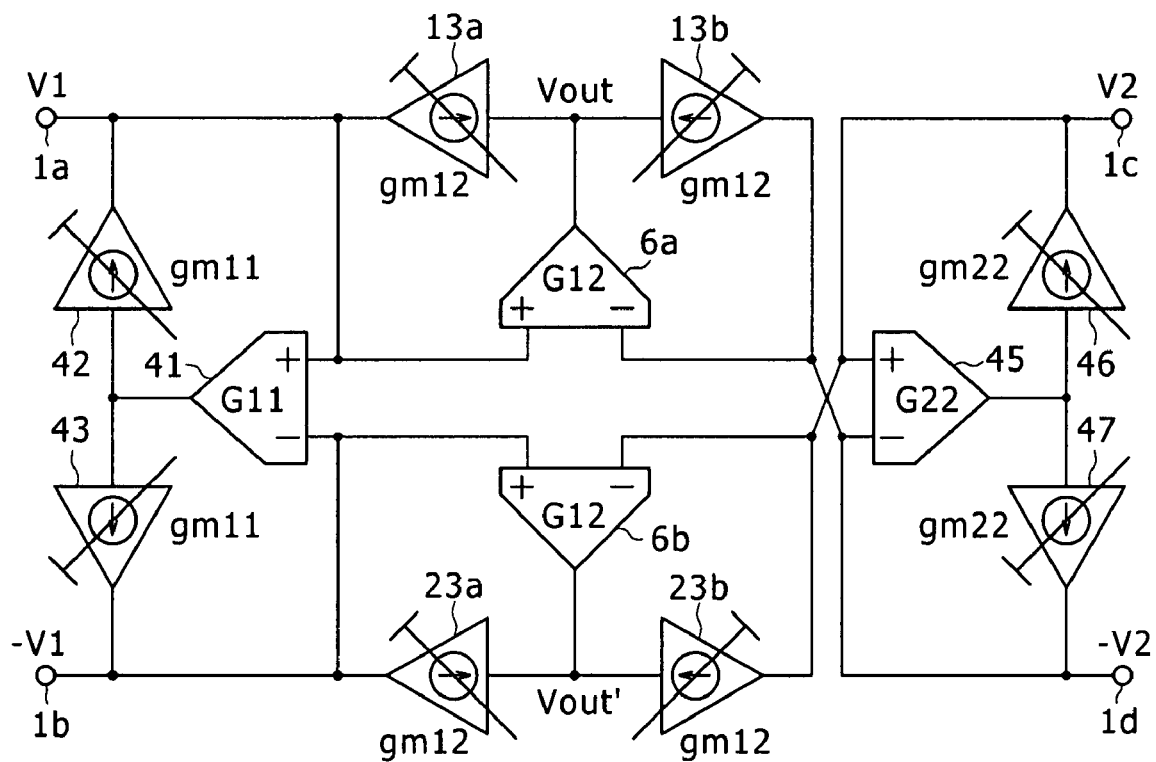
FIG. 24 is a diagram showing an impedance conversion circuit according to a fifth embodiment.
Figure 25:
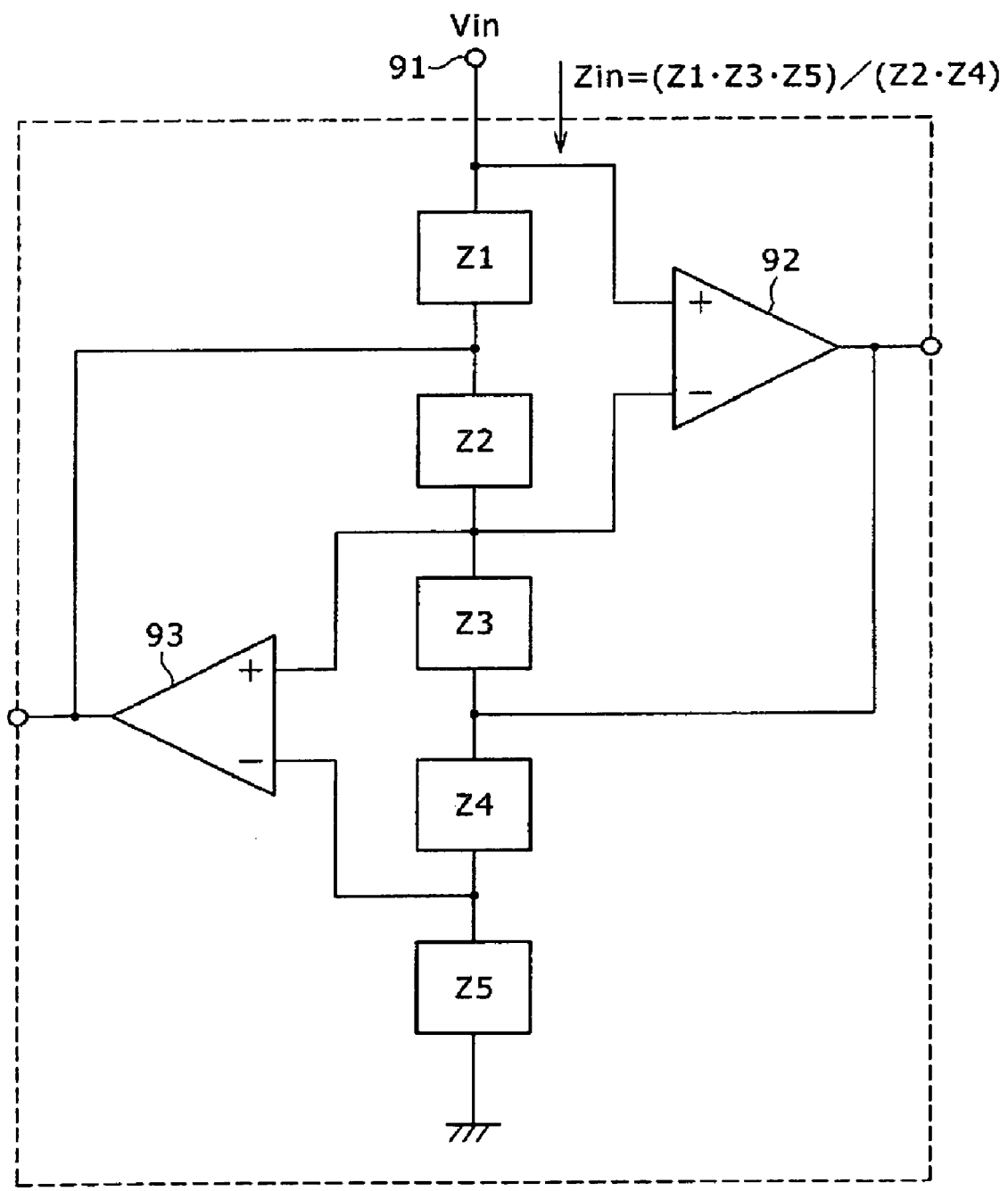
FIG. 25 is a diagram showing an impedance conversion circuit in the related art.

5. Fifth Embodiment: FIG. 24

FIG. 24 shows an impedance conversion circuit according to a fifth embodiment.

This example is basically the same as the example of FIG. 17. In this case, an impedance between terminals 1a and 1b on an input side is set as the above-described impedance Z11, and the impedance Z11 is formed as a differential type impedance by an arithmetic circuit 41 and voltage-to-current converters 42 and 43. An impedance between terminals 1c and 1d on an output side is set as the above-described impedance Z22, and the impedance Z22 is formed as a differential type impedance by an arithmetic circuit 45 and voltage-to-current converters 46 and 47.

Suppose that the arithmetic circuit 41 generates a transfer function G11, and that the arithmetic circuit 45 generates a transfer function G22. Suppose that the conductance of the voltage-to-current converters 42 and 43 is gm11, and that the conductance of the voltage-to-current converters 46 and 47 is gm22.

In this case, the impedances Z11 and Z22 and an impedance Z12 between the terminals 1a and 1d and between the terminals 1b and 1c are expressed by:

$$Z11 = 2 \times G11 \times gm11 \quad (81)$$

$$Z22 = 2 \times G22 \times gm22 \quad (82)$$

$$Z12 = G12 \times gm12 \quad (83)$$

Also in this example, as in the example of FIG. 17, a ladder circuit as shown in FIG. 20 can be formed, and a differential type third-order low-pass filter (third-order Chebyshev type low-pass filter) as shown in FIG. 21 can be formed.

6. Effects of Embodiments

The impedance conversion circuit according to each of the above-described embodiments can be formed by a smaller number of elements than that of the impedance conversion circuit in the related art. It is therefore possible to reduce power consumption, widen a frequency band for use, and realize an active filter for up to a high frequency.

By using an operational amplifier having a wide dynamic range as an inverting amplifier, it is possible to widen the dynamic ranges of input and output, and filter a massive input.

The use of voltage-to-current converters in an input part enables all bias points to be set at a center of power supply voltage, which is advantageous in decreasing voltage and increases resistance to distortion. In addition, a CMOS process unsuitable for active filters in the past can be used.

Because a symmetrical four-terminal network can be formed by a smaller number of elements than that of the related art, it is possible to widen a frequency band for use, realize an active filter for up to a high frequency, and realize a steep filtering characteristic.

It is possible to freely control an impedance value after conversion by a ratio between the conductance of a voltage-to-current converter and a resistance value for the impedance value being used, and thus easily realize an impedance having an appropriate value within an integrated circuit.

The formation of a symmetrical four-terminal network enables differential processing of all signals, and thus enables analog signal processing highly resistant to noise such as radiation or the like within the integrated circuit.

With a configuration in which a linear element such as a resistance or the like is used as impedance Z and the conductance of a voltage-to-current converter can be changed, it is possible to realize a gain control amplifier circuit with a linear gain control characteristic.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing method using an impedance conversion circuit comprising:
   providing a first voltage-to-current converter and a second voltage-to-current converter supplied with differential input signal voltages;
   providing an inverting amplifier; and
   generating a feedback signal with a third voltage-to-current converter,
   wherein a first resistance and a second resistance are connected in series with each other between an input terminal and an output terminal of said inverting amplifier,
   an output terminal of said first voltage-to-current converter is connected to the input terminal of said inverting amplifier,
   an output terminal of said second voltage-to-current converter is connected to a connection node of said first resistance and said second resistance,
   the output terminal of said inverting amplifier is connected to an input terminal of said third voltage-to-current converter,
   an output terminal of said third voltage-to-current converter is connected to an input terminal of said first voltage-to-current converter, and
   an impedance is connected between said connection node and a ground.

2. A signal processing method using an impedance conversion circuit comprising:
   providing a first circuit and a second circuit;
   wherein each of the two circuits includes a first voltage-to-current converter and a second voltage-to-current converter, an inverting amplifier, and a third voltage-to-current converter for feedback;
   providing a first resistance and a second resistance connected in series with each other between an input terminal and an output terminal of said inverting amplifier;

wherein an output terminal of said first voltage-to-current converter is connected to the input terminal of said inverting amplifier;

an output terminal of said second voltage-to-current converter connected to a connection node of said first resistance and said second resistance;

the output terminal of said inverting amplifier connected to an input terminal of said third voltage-to-current converter;

an output terminal of said third voltage-to-current converter being connected to an input terminal of said first voltage-to-current converter; and an impedance being connected between said connection node and a ground, supplying an identical input signal voltage to said first voltage-to-current converter in said first circuit and said second voltage-to-current converter in said second circuits and supplying a differential input signal voltage with respect to said input signal voltage to said first voltage-to-current converter in said second circuit and said second voltage-to-current converter in said first circuit.

3. A signal processing method using impedance conversion circuit comprising:

providing a first circuit and a second circuit;

wherein each of the two circuits includes a first voltage-to-current converter, a second voltage-to-current converter, a third voltage-to-current converter, a fourth voltage-to-current converter, a fifth voltage-to-current converter, and a sixth voltage-to-current converter, and an inverting amplifier;

providing a first resistance and a second resistance connected in series with each other between an input terminal and an output terminal of said inverting amplifier;

wherein an output terminal of said first voltage-to-current converter and an output terminal of said fourth voltage-to-current converter is connected to the input terminal of said inverting amplifier;

an output terminal of said second voltage-to-current converter and an output terminal of said fifth voltage-to-current converter is connected to a connection node of said first resistance and said second resistance;

the output terminal of said inverting amplifier being connected to an input terminal of said third voltage-to-current converter and an input terminal of said sixth voltage-to-current converter;

an output terminal of said third voltage-to-current converter being connected to an input terminal of said first voltage-to-current converter;

an output terminal of said sixth voltage-to-current converter being connected to an input terminal of said fourth voltage-to-current converter; and an impedance being connected between said connection node and a ground, wherein the input terminal of said first voltage-to-current converter in said first circuit and the input terminal of said second voltage-to-current converter in said second circuit are connected as a first terminal, the input terminal of said first voltage-to-current converter in said second circuit and the input terminal of said second voltage-to-current converter in said first circuit are connected as a second terminal, the input terminal of said fourth voltage-to-current converter in said first circuit and the input terminal of said fifth voltage-to-current converter in said second circuit are connected as a third terminal, the input terminal of said fourth voltage-to-current converter in said second circuit and the input terminal of said fifth voltage-to-current converter in said first circuit are connected as a fourth terminal, and said first terminal and second terminal are supplied with differential input signal voltages.

4. The signal processing method using an impedance conversion circuit as claimed in claim 3, wherein an impedance is connected between said first terminal and said second terminal, and an impedance is connected between said third terminal and said fourth terminal.

5. The signal processing method using an impedance conversion circuit as claimed in claim 4, wherein said impedances are differential type impedances.

6. A method of manufacturing an integrated circuit comprising:

providing a first voltage-to-current converter and a second voltage-to-current converter which are to be supplied with differential input signal voltages;

providing an inverting amplifier; and a third voltage-to-current converter for feedback, wherein a first resistance and a second resistance are connected in series with each other between an input terminal and an output terminal of said inverting amplifier, wherein an output terminal of said first voltage-to-current converter is connected to the input terminal of said inverting amplifier, an output terminal of said second voltage-to-current converter is connected to a connection node of said first resistance and said second resistance, the output terminal of said inverting amplifier is connected to an input terminal of said third voltage-to-current converter, an output terminal of said third voltage-to-current converter is connected to an input terminal of said first voltage-to-current converter, and an impedance is connected between said connection node and a ground.

* * * * *